United States Patent
Chou et al.

(10) Patent No.: US 10,903,350 B2
(45) Date of Patent: Jan. 26, 2021

(54) SEMICONDUCTOR DEVICES AND METHODS FOR FORMING THE SAME

(71) Applicant: Vanguard International Semiconductor Corporation, Hsinchu (TW)

(72) Inventors: Cheng-Wei Chou, Taoyuan (TW); Hsin-Chih Lin, Hsinchu (TW); Yu-Chieh Chou, New Taipei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/281,978

(22) Filed: Feb. 21, 2019

(65) Prior Publication Data
US 2020/0273976 A1 Aug. 27, 2020

(51) Int. Cl.
*H01L 29/778* (2006.01)
*H01L 29/20* (2006.01)
(Continued)

(52) U.S. Cl.
CPC ...... *H01L 29/7787* (2013.01); *H01L 29/2003* (2013.01); *H01L 29/407* (2013.01); *H01L 29/66462* (2013.01)

(58) Field of Classification Search
CPC ..... H01L 29/452; H01L 29/475; H01L 29/22; H01L 29/20; H01L 29/242;
(Continued)

(56) References Cited

U.S. PATENT DOCUMENTS

| 7,291,872 B2 * | 11/2007 | Hikita | H01L 29/4175 |
| | | | 257/192 |
| 8,592,865 B1 * | 11/2013 | Hughes | H01L 29/66431 |
| | | | 257/192 |

(Continued)

FOREIGN PATENT DOCUMENTS

| TW | 201637210 A | 10/2016 |
| TW | 201715616 A | 5/2017 |

OTHER PUBLICATIONS

U.S. Office Action dated May 15, 2019, for U.S. Appl. No. 15/857,347.
Office Action for TW 106138596 dated Sep. 21, 2018.

*Primary Examiner* — Yasser A Abdelaziez
(74) *Attorney, Agent, or Firm* — Birch, Stewart, Kolasch & Birch, LLP

(57) ABSTRACT

A semiconductor device includes a first composite III-V group compound semiconductor layer disposed on a composite substrate, and a second III-V group compound semiconductor layer disposed on the first composite III-V group compound semiconductor layer. The semiconductor device also includes a gate structure disposed on the second III-V group compound semiconductor layer, and a source electrode and a drain electrode disposed on the second III-V group compound semiconductor layer and at opposite sides of the gate structure. The semiconductor device further includes a field plate disposed between the gate structure and the drain electrode, and a conductive structure penetrating through the second III-V group compound semiconductor layer and the first composite III-V group compound semiconductor layer, wherein the field plate is electrically connected to the composite substrate through the conductive structure.

20 Claims, 15 Drawing Sheets

(51) Int. Cl.
*H01L 29/40* (2006.01)
*H01L 29/66* (2006.01)

(58) Field of Classification Search
CPC ........... H01L 29/7787; H01L 29/66462; H01L 29/407; H01L 29/2003
See application file for complete search history.

(56) References Cited

U.S. PATENT DOCUMENTS

| | | | |
|---|---|---|---|
| 9,306,014 B1* | 4/2016 | Kudymov | H01L 29/2003 |
| 9,859,399 B2* | 1/2018 | Chen | H01L 29/7816 |
| 2011/0169054 A1 | 7/2011 | Wu et al. | |
| 2014/0342520 A1* | 11/2014 | Su | H01L 29/402 |
| | | | 438/273 |
| 2015/0340237 A1 | 11/2015 | Rezanezhad Gatabi | |
| 2017/0117400 A1 | 4/2017 | Xiao | |
| 2017/0294258 A1 | 10/2017 | Kezuka et al. | |

* cited by examiner

SEMICONDUCTOR DEVICES AND METHODS FOR FORMING THE SAME

BACKGROUND

Field of the Invention

The invention relates to semiconductor devices, and in particular to semiconductor devices having conductive structure electrically connecting field plate and substrate and methods for forming the same.

Description of the Related Art

Semiconductor devices are used in a variety of electronic applications, such as high-power devices, personal computers, cell phones, digital cameras, and other electronic devices. These semiconductor devices are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these devices, high-electron mobility transistors (HEMTs) have been widely used in the field of high-power applications since they have such advantages as high output power and high breakdown voltage.

Although existing semiconductor devices and methods for manufacturing the same have been adequate for their intended purposes, they have not been entirely satisfactory in all respects. Therefore, up to the present, there are still some problems to be overcome in regards to semiconductor integrated circuits and technology.

BRIEF SUMMARY

Embodiments of semiconductor devices and methods for forming the same are provided, especially a high-electron mobility transistor (HEMT). In some embodiments of the present disclosure, a composite substrate with high thermal conductivity coefficient is used, and a field plate disposed between a gate structure and a drain electrode is electrically connected to the composite substrate through a conductive structure, so as to achieve the purpose of heat dissipation and reducing the electric field. As a result, the operational efficiency of the high current density semiconductor devices can be improved.

Some embodiments of the disclosure provide a semiconductor device. The semiconductor device includes a first composite III-V group compound semiconductor layer disposed on a composite substrate, and a second III-V group compound semiconductor layer disposed on the first composite III-V group compound semiconductor layer. The semiconductor device also includes a gate structure disposed on the second III-V group compound semiconductor layer, and a source electrode and a drain electrode disposed on the second III-V group compound semiconductor layer and at opposite sides of the gate structure. The semiconductor device further includes a field plate disposed between the gate structure and the drain electrode, and a conductive structure penetrating through the second III-V group compound semiconductor layer and the first composite III-V group compound semiconductor layer, wherein the field plate is electrically connected to the composite substrate through the conductive structure.

Some embodiments of the disclosure provide a semiconductor device. The semiconductor device includes a first composite III-V group compound semiconductor layer disposed on a composite substrate, and a second III-V group compound semiconductor layer disposed on the first composite III-V group compound semiconductor layer. The semiconductor device also includes a source electrode, a gate structure and a drain electrode disposed on the second III-V group compound semiconductor layer, and the gate structure is located between the source electrode and the drain electrode. The semiconductor device further includes a first field plate region disposed between the gate structure and the drain electrode, and a first conductive structure electrically connected to the first field plate region and the composite substrate, wherein the first conductive structure is electrically isolated from the source electrode.

Some embodiments of the disclosure provide a method for forming a semiconductor device. The method includes forming a first composite III-V group compound semiconductor layer on a composite substrate, and forming a second III-V group compound semiconductor layer on the first composite III-V group compound semiconductor layer. The method also includes forming a source electrode, a gate structure and a drain electrode on the second III-V group compound semiconductor layer, and the gate structure is located between the source electrode and the drain electrode. The method further includes forming a field plate between the gate structure and the drain electrode, and forming a conductive structure penetrating through the second III-V group compound semiconductor layer and the first composite III-V group compound semiconductor layer, and the field plate is electrically connected to the composite substrate through the conductive structure.

The semiconductor devices of the present disclosure may be applied to different types of semiconductor devices. In order to make the features and the advantages of the present disclosure more apparent and easy to understand, the embodiments of enhancement mode (i.e. normally-off) high-electron mobility transistors (HEMTs) are provided in the following descriptions with reference to the accompanying drawings

BRIEF DESCRIPTION OF THE DRAWINGS

The disclosure can be more fully understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G is a cross-sectional view along line I-I' of the semiconductor device in FIG. 2.

FIG. 6B is a cross-sectional view along line X1-X2 of the semiconductor device in FIG. 6A.

FIG. 7B is a cross-sectional view along line X1-X2 of the semiconductor device in FIG. 7A.

FIG. 8B is a cross-sectional view along line X1-X2 of the semiconductor device in FIG. 8A.

DETAILED DESCRIPTION OF THE INVENTION

Figure 1A:
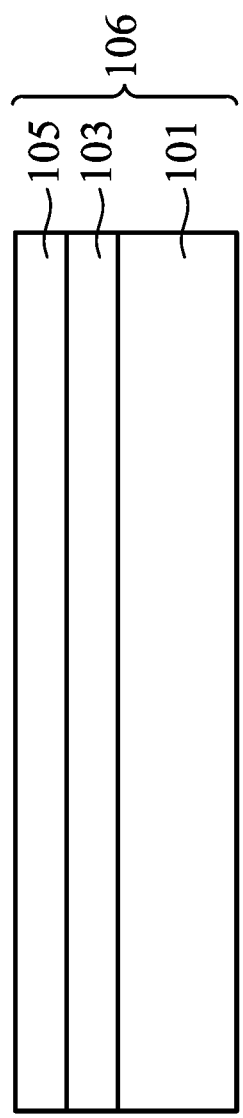
FIGS. 1A to 1G are cross-sectional views illustrating intermediate stages of a method for forming the semiconductor device of FIG. 1G in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Figure 1B:
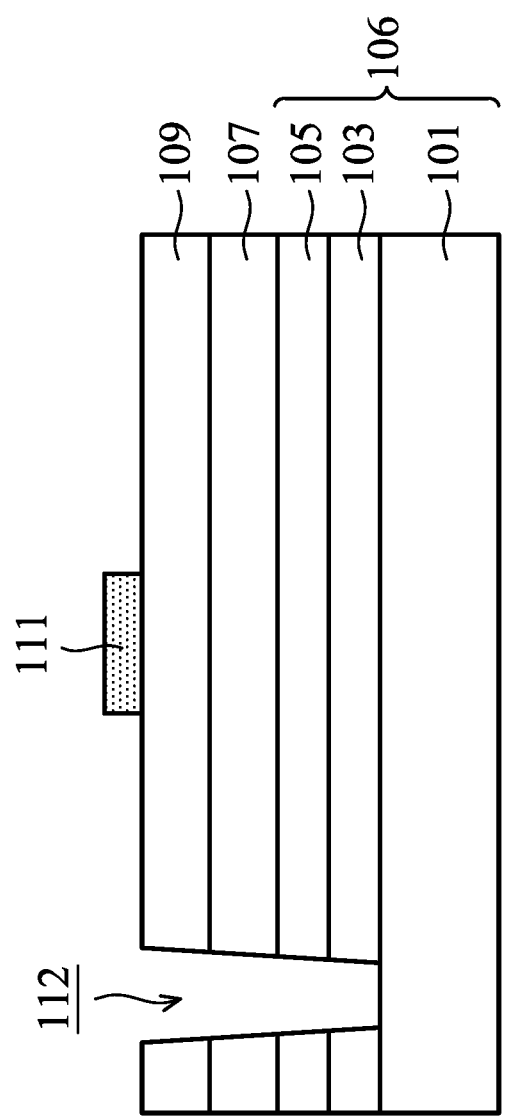
Figure 1C:
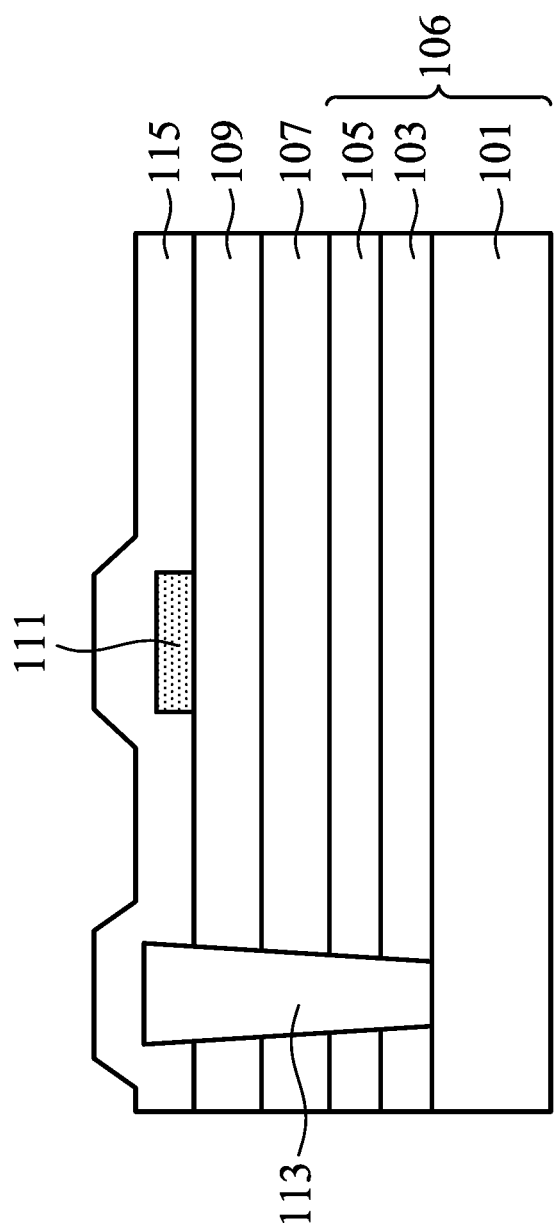
Figure 1D:
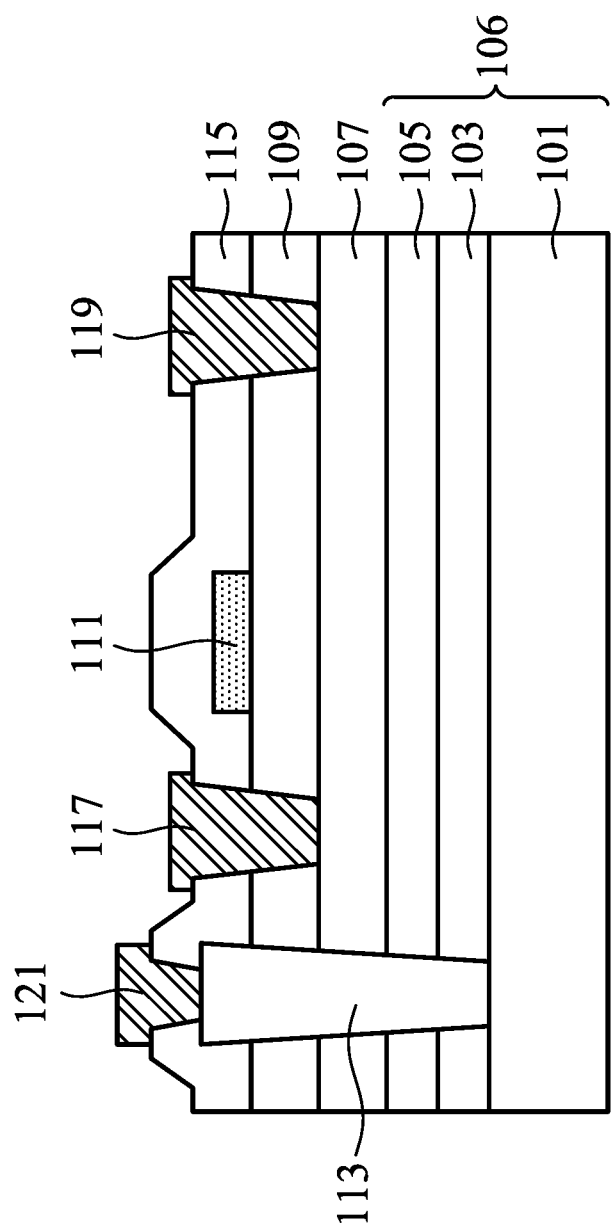
Figure 1E:
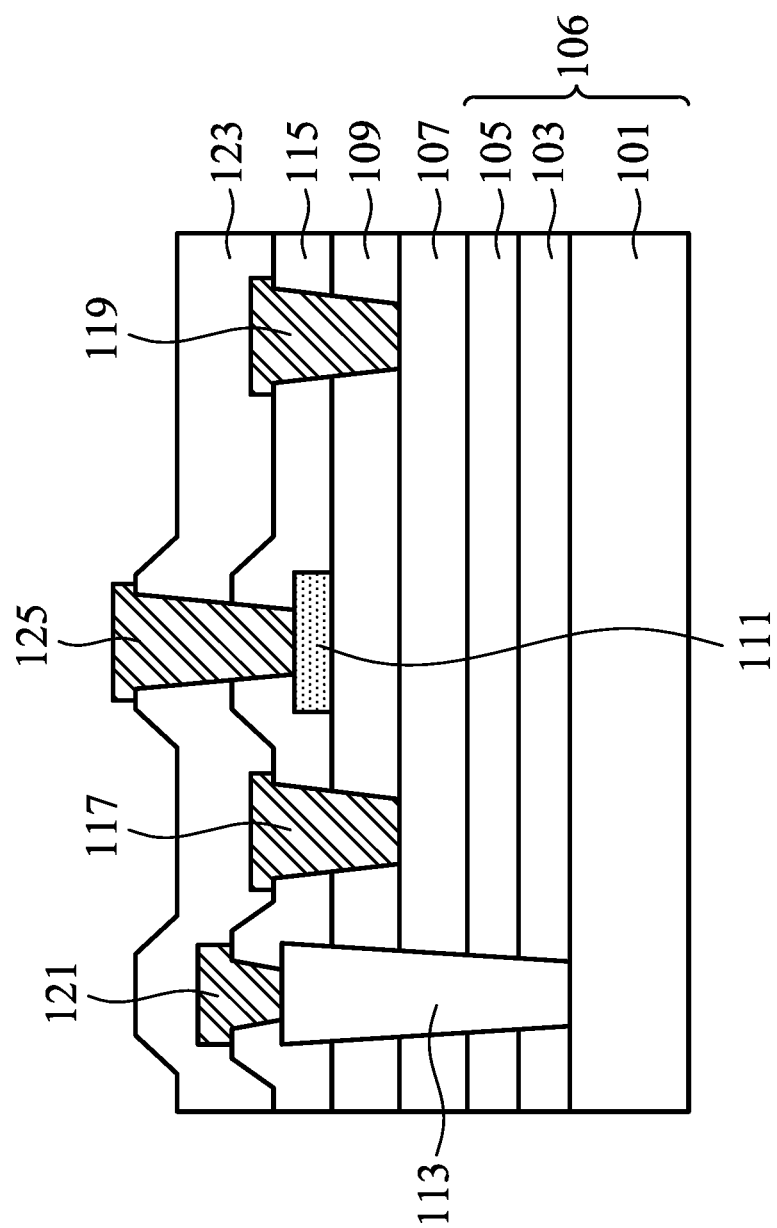
Figure 1F:
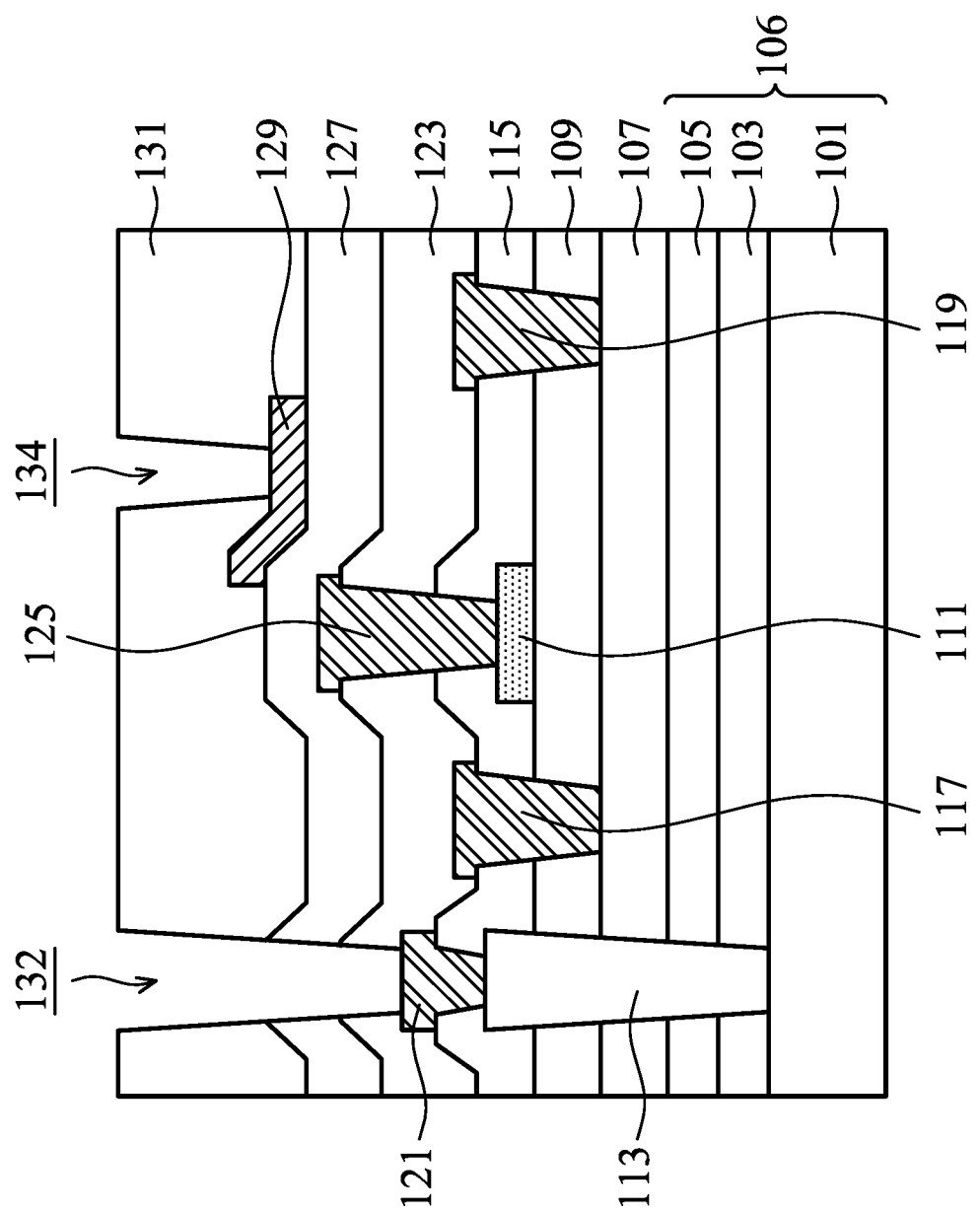
Figure 1G:
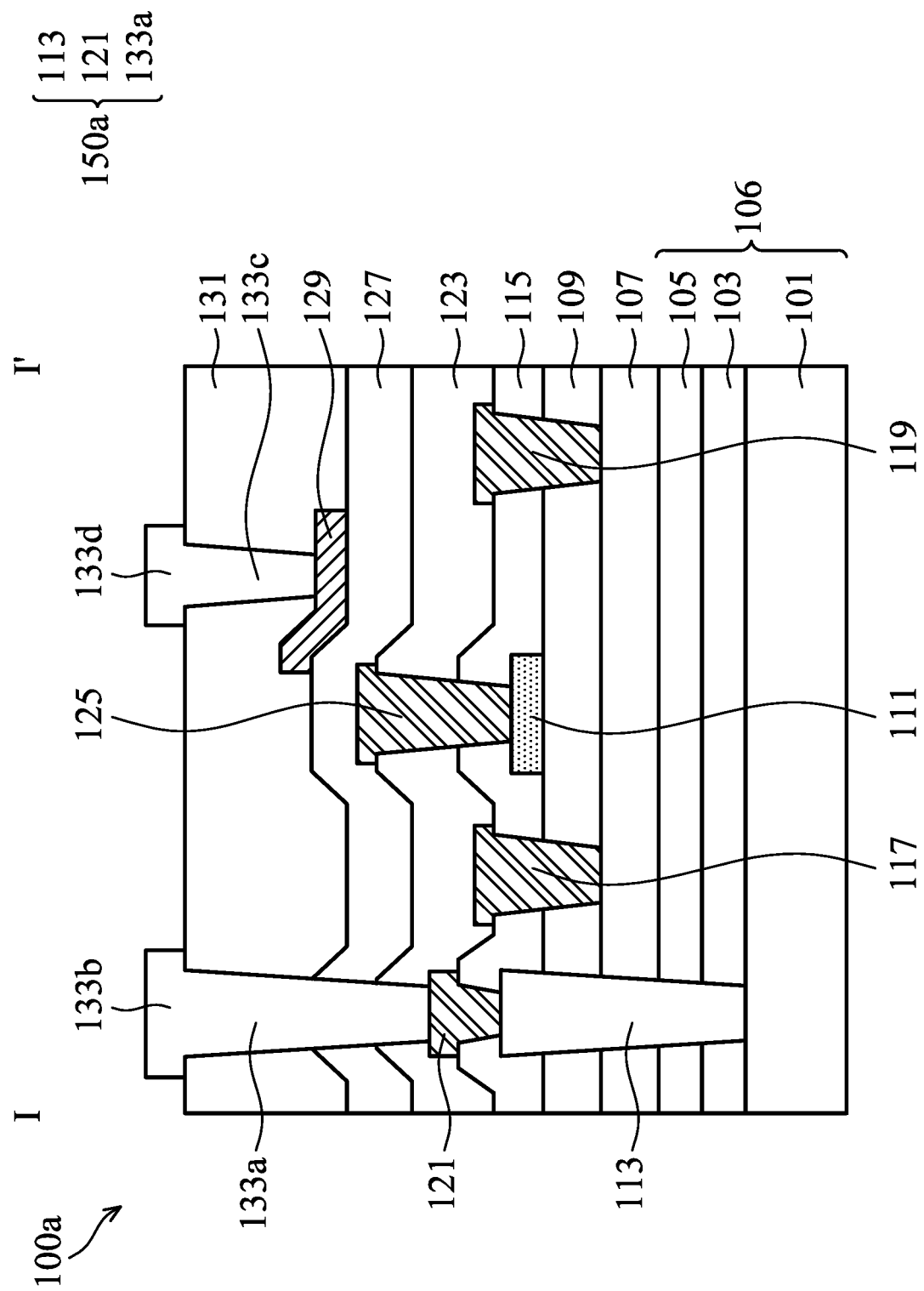

FIGS. 1A to 1G are cross-sectional views illustrating intermediate stages of a method for forming the semiconductor device 100a of FIG. 1G in accordance with some embodiments.

As shown in FIG. 1A, a composite substrate 106 is provided, in accordance with some embodiments. In some embodiments, the composite substrate 106 includes a substrate 101, a buffer layer 103 disposed on the substrate 101, and a seed layer 105 disposed on the buffer layer 103. It should be noted that, the substrate 101 may be made of a material having a high thermal conductivity coefficient, such as aluminum nitride (AlN). In some embodiments, the substrate 101 includes a ceramic material. The ceramic material may include a metal inorganic material. In some other embodiments, the substrate 101 is made of silicon (Si), silicon carbide (SiC), gallium nitride (GaN), silicon dioxide ($SiO_2$), sapphire or a combination thereof. The aforementioned sapphire substrate may be formed by aluminum nitride and gallium nitride formed on the aluminum nitride.

In some embodiments, the buffer layer 103 is used as a spacer layer that is disposed between the substrate 101 and a seed layer 105 which is formed subsequently, so as to prevent the seed layer 105 from coming into direct contact with the substrate 101. The buffer layer 103 may be made of silicon oxide, silicon nitride, silicon oxynitride, a combination thereof or another applicable material. In some embodiments, the methods for forming the buffer layer 103 may include metal organic chemical vapor deposition (MOCVD), molecular beam epitaxy (MBE), hydride vapor phase epitaxy (HVPE), another applicable method or a combination thereof. In addition, in some embodiments, the buffer layer 103 is a multi-layered structure.

In some embodiments, the seed layer 105 is made of silicon (Si) or another applicable material. In some embodiments, the methods for forming the seed layer 105 include a selective epitaxial growth (SEG) process, a chemical vapor deposition (CVD) process (e.g., a vapor-phase epitaxy (VPE) process, a low pressure CVD (LPCVD) process, and/or an ultra-high vacuum CVD (UHV-CVD) process), a molecular beam epitaxy process, deposition of doped amorphous semiconductor (e.g., Si) followed by a solid-phase epitaxial recrystallization (SPER) step, methods of directly pasting seed crystals, or another applicable process. The composite substrate 106 shown in FIG. 1A is composed of the substrate 101, the buffer layer 103 and the seed layer 105. However, the present disclosure is not limited thereto. For example, the composite substrate 106 may further include other films and/or layers.

Next, as shown in FIG. 1B, a first composite III-V group compound semiconductor layer 107 is formed on the composite substrate 106, and a second III-V group compound semiconductor layer 109 is formed on the first composite III-V group compound semiconductor layer 107. In some embodiments, the first composite III-V group compound semiconductor layer 107 is made of undoped gallium nitride (GaN), or a multi-layered structure including doped and undoped GaN alternatively stacked, and the second III-V group compound semiconductor layer 109 is made of doped aluminium gallium nitride (AlGaN).

In some other embodiments, the materials of the first composite III-V group compound semiconductor layer 107 and the second III-V group compound semiconductor layer 109 may include aluminium gallium nitride (AlGaN), gallium nitride (GaN), aluminium nitride (AlN), gallium arsenide (GaAs), gallium indium phosphide (GaInP), aluminium gallium arsenide (AlGaAs), indium phosphide (InP), indium gallium arsenide (InGaAs), another applicable III-V group compound material or a combination thereof. It should be noted that, the first composite III-V group compound semiconductor layer 107 and the second III-V group compound semiconductor layer 109 include different materials from each other to form a heterojunction, and thus a two-dimensional electron gas (2DEG) which is generated by the band gap between the hetero-materials may be formed at the interface between the first composite III-V group compound semiconductor layer 107 and the second III-V group compound semiconductor layer 109.

Moreover, the methods for forming the first composite III-V group compound semiconductor layer 107 and the second III-V group compound semiconductor layer 109 may include metal organic chemical vapor deposition (MOCVD) or other applicable methods. In some other embodiments, the first composite III-V group compound semiconductor layer 107 and the second III-V group compound semiconductor layer 109 may include multi-layered structure respectively.

Afterwards, as shown in FIG. 1B, a gate structure 111 is formed on the second III-V group compound semiconductor layer 109, and a first trench 112 is formed penetrating through the second III-V group compound semiconductor layer 109, the first composite III-V group compound semiconductor layer 107, the seed layer 105 and the buffer layer 103.

In some embodiments, the gate structure 111 is made of p-type doped gallium nitride (GaN). In some other embodiments, the gate structure 111 includes aluminium gallium nitride (AlGaN), gallium nitride (GaN), aluminium nitride (AlN), gallium arsenide (GaAs), gallium indium phosphide (GaInP), aluminium gallium arsenide (AlGaAs), indium phosphide (InP), indium aluminum arsenide (InAlAs), indium gallium arsenide (InGaAs), another applicable III-V group compound material or a combination thereof with p-type dopants. In addition, the methods for forming the gate structure 111 may include the aforementioned deposition or epitaxy processes, and ion implantation or in-situ doping processes.

Moreover, the gate structure 111 can be selectively formed. For example, in a depletion mode (i.e. normally-on) high-electron mobility transistor (HEMT), the gate structure 111 can be omitted. In this embodiment, the gate metal layer 125 which is formed subsequently will be in direct contact with the second III-V group compound semiconductor layer 109, and the gate metal layer 125 formed subsequently will be used as the gate structure of the semiconductor device.

It should be noted that a portion of the second III-V group compound semiconductor layer 109, a portion of the first composite III-V group compound semiconductor layer 107, a portion of the seed layer 105 and a portion of the buffer layer 103 are removed to form the first trench 112. The method for forming the first trench 112 may include forming a mask layer (not shown) on the second III-V group compound semiconductor layer 109. Then, the mask layer is patterned by performing a patterning process such that a patterned mask (not shown) is formed. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process. As a result, a portion of the second III-V group compound semiconductor layer 109 is exposed by the patterned mask. Afterwards, the first trench 112 is formed by performing a dry etching process or a wet etching process using the patterned mask as a mask.

As shown in FIG. 1C, a first conductive portion 113 is formed in the first trench 112, and a first dielectric layer 115 is formed on the second III-V group compound semiconductor layer 109, in accordance with some embodiments. The first conductive portion 113 and the gate structure 111 are conformally covered by the first dielectric layer 115.

In some embodiments, the first conductive portion 113 is made of polysilicon, metals, or other conductive materials. The first conductive portion 113 may be formed by a deposition process, such as a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof.

In addition, the first dielectric layer 115 may be made of silicon oxide, silicon nitride, silicon oxynitride, a combination thereof or another applicable material. Moreover, the first dielectric layer 115 may be formed by a chemical vapor deposition (CVD) process, a physical vapor deposition (PVD) process, an atomic layer deposition (ALD) process, a high density plasma chemical vapor deposition (HDPCVD) process, or a combination thereof.

As shown in FIG. 1D, a second conductive portion 121 is formed on the first conductive portion 113, and a source electrode 117 and a drain electrode 119 are formed on the second III-V group compound semiconductor layer 109, in accordance with some embodiments. Specifically, the second conductive portion 121, the source electrode 117 and the drain electrode 119 penetrate through the first dielectric layer 115 and the second III-V group compound semiconductor layer 109. In some other embodiments, a bottom portion of the source electrode 117 and a bottom portion of the drain electrode 119 are embedded in the first composite III-V group compound semiconductor layer 107. In the present embodiment, the gate structure 111 is located between the source electrode 117 and the drain electrode 119.

In some embodiments, the second conductive portion 121, the source electrode 117 and the drain electrode 119 are made of conductive materials, such as aluminum (Al), copper (Cu), tungsten (W), titanium (Ti), tantalum (Ta), titanium nitride (TiN) or another applicable material. In addition, the second conductive portion 121, the source electrode 117 and the drain electrode 119 may be a single-layer metal structure or a multi-layer metal stacked structure respectively. The source electrode 117, the drain electrode 119 and the first composite III-V group compound semiconductor layer 107 may have Ohmic contact formed therebetween.

It should be noted that, in some embodiments, the second conductive portion 121, the source electrode 117 and the drain electrode 119 are formed in the same process by using the same material. Moreover, the methods for forming the second conductive portion 121, the source electrode 117 and the drain electrode 119 may be similar to, or the same as the method for forming the first conductive portion 113, and are not repeated herein.

Afterwards, as shown in FIG. 1E, a second dielectric layer 123 is formed on the first dielectric layer 115, and a gate metal layer 125 is formed on the gate structure 111, in accordance with some embodiments. Specifically, the gate metal layer 125 penetrates through the second dielectric layer 123 and the first dielectric layer 115, and the gate metal layer 125 is in direct contact with the gate structure 111.

In some embodiments, the materials and processes used to form the second dielectric layer 123 are similar to, or the same as, those used to form the first dielectric layer 115, and are not repeated herein. Moreover, in some embodiments, the gate metal layer 125 is made of conductive materials, such as nickel (Ni), gold (Au), a combination thereof, or another applicable material. The gate metal layer 125 and the gate structure 111 may have Schottky contact formed therebetween. The materials and processes used to form the gate metal layer 125 may be similar to, or the same as, those used to form the first conductive portion 113, and are not repeated herein.

As shown in FIG. 1F, a third dielectric layer 127 is formed on the second dielectric layer 123, and a field plate 129 is formed on the third dielectric layer 127, in accordance with some embodiments. Specifically, the field plate 129 is located on the gate metal layer 125, and the field plate 129 extends between the gate metal layer 125 and the drain electrode 119. The field plate 129 is electrically isolated from the gate metal layer 125 by the third dielectric layer 127.

In some embodiments, the materials and processes used to form the third dielectric layer 127 are similar to, or the same as, those used to form the first dielectric layer 115, and are not repeated herein. Moreover, in some embodiments, the field plate 129 is made of polysilicon, metals, or other applicable conductive materials, and the field plate 129 is formed by using a deposition process and a patterning process.

Afterwards, a fourth dielectric layer 131 is formed on the third dielectric layer 127. The materials and processes used to form the fourth dielectric layer 131 are similar to, or the same as, those used to form the first dielectric layer 115, and are not repeated herein. Next, a second trench 132 is formed on the second conductive portion 121, and an opening 134 is formed on the field plate 129. Specifically, a portion of the second dielectric layer 123, a portion of the third dielectric layer 127 and a portion of the fourth dielectric layer 131 are removed to form the second trench 132 exposing the second conductive portion 121, and another portion of the fourth dielectric layer 131 is removed to form the opening 134 exposing the field plate 129. In some embodiments, the second trench 132 and the opening 134 are formed in the same etching process.

As shown in FIG. 1G, a third conductive portion 133a is formed in the second trench 132, a conductive layer 133b is formed on the third conductive portion 133a, a via 133c is formed in the opening 134, and a conductive layer 133d is formed on the via 133c. In some embodiments, the third conductive portion 133a, the conductive layer 133b, the via 133c and the conductive layer 133d are made of metals, polysilicon or other applicable conductive materials, and the third conductive portion 133a, the conductive layer 133b, the via 133c and the conductive layer 133d are formed by a deposition process and a patterning process.

After the conductive layers 133b and 133d are formed, the formation of the semiconductor device 100a having a conductive structure 150a is completed. It should be noted that, the conductive structure 150a includes the first conductive portion 113, the second conductive portion 121 and the third conductive portion 133a, and the conductive structure 150a and the gate metal layer 125 are located at opposite sides of the source electrode 117.

Figure 2:
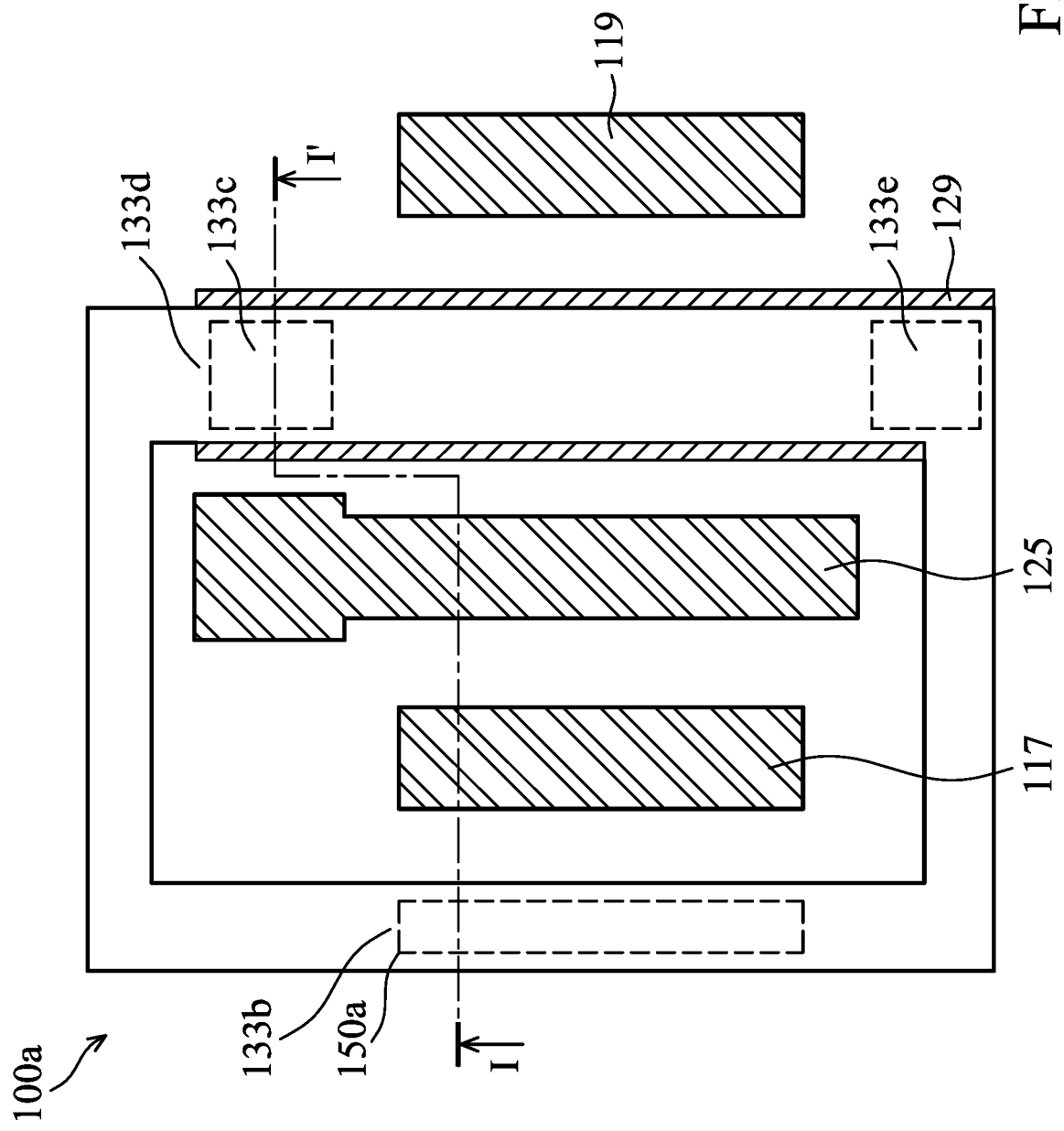
FIG. 2 is a top view illustrating a semiconductor device in accordance with some embodiments.

FIG. 2 is a top view illustrating a semiconductor device 100a in accordance with some embodiments. FIG. 1G is a cross-sectional view along line I-I' of the semiconductor device 100a in FIG. 2. Referring to FIGS. 1G and 2, the conductive layer 133b and the conductive layer 133d are connected as a ring structure, and the field plate 129 is electrically connected to the substrate 101 inside the composite substrate 106 through the via 133c, the ring structure including the conductive layers 133b and 133d and the conductive structure 150a.

Moreover, as shown in FIG. 2, the field plate 129 is electrically connected to the ring structure including the conductive layers 133b and 133d by disposing an additional via 133e, in accordance with some embodiments. In some embodiments, either of the vias 133c and 133e can be omitted.

In some embodiments, the field plate 129 extends between the gate metal layer 125 and the drain electrode 119 to reduce the electric field close to the drain electrode 119 of the semiconductor device 100a, such that the electric field between the gate metal layer 125 and the drain electrode 119 becomes less intensive, and the breakdown problem can be reduced or mitigated. In the present embodiment, the field plate 129 is electrically connected to the composite substrate with a high thermal conductivity coefficient (e.g., the composite substrate 106 including the substrate 101 which is made of aluminum nitride) through the conductive structure 150a penetrating through the second III-V group compound semiconductor layer 109 and the first composite III-V group compound semiconductor layer 107, so as to achieve the purposes of heat dissipation and reducing the electric field. As a result, the operational efficiency of the high current density semiconductor device 100a can be improved.

In addition, the conductive structure 150a is disposed away from the active area between the source electrode 117 and the drain electrode 119. Therefore, the semiconductor device 100a can be prevented from being damaged. Moreover, in the present embodiment, the conductive structure 150a does not penetrate through the substrate 101 of the composite substrate 106, and the conductive structure 150a does not extend to the region directly under the source electrode 117. In other words, the conductive structure 150a does not extend to the backside of the composite substrate 106, and the conductive structure 150a does not extend to the region directly under the active area. Therefore, the breakdown voltage of the semiconductor device 100a can remain at a high level, such that the applicable voltage range of the semiconductor device 100a may not be limited.

Figure 3:
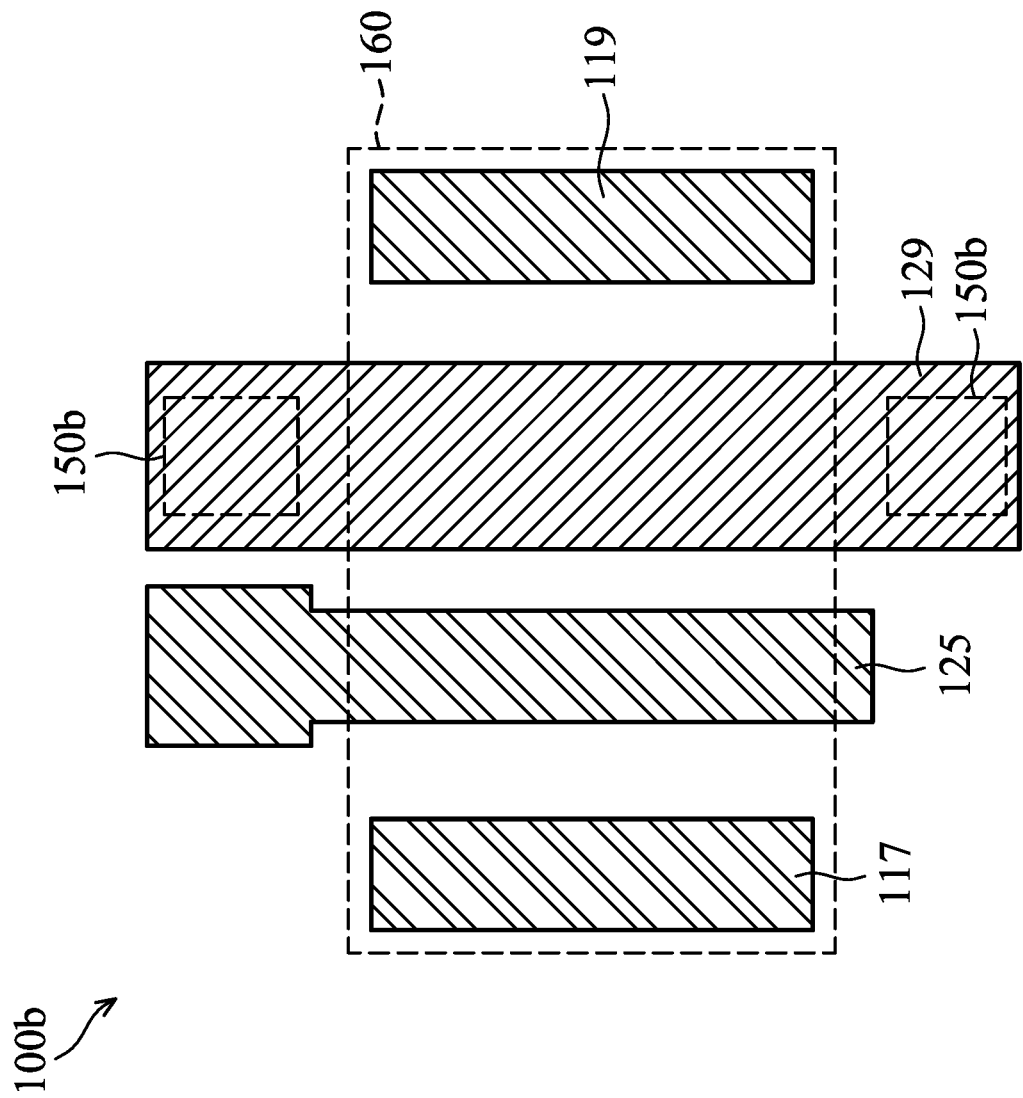
FIG. 3 is a top view illustrating a semiconductor device in accordance with some embodiments.

FIG. 3 is a top view illustrating a semiconductor device 100b in accordance with some embodiments. The difference between the semiconductor device 100b and the semiconductor device 100a is the location of the conductive structure.

As shown in FIG. 3, in the semiconductor device 100b, the field plate 129 is electrically connected to the composite substrate 106 by disposing a conductive structure 150b under the field plate 129, and the conductive structure 150b is located in the region directly under the field plate 129, in accordance with some embodiments. Specifically, the range of the projection of the conductive structure 150b on the top surface of the composite substrate 106 is located in the range of the projection of the field plate 129 on the top surface of the composite substrate 106. Some materials and processes used to form the conductive structure 150b are similar to, or the same as, those used to form the conductive structure 150a, and are not repeated herein.

In addition, since the conductive structure 150b of the semiconductor device 100b is disposed directly under the field plate 129, the via 133c and the ring structure including the conductive layers 133b and 133d of the semiconductor device 100a can be omitted. Therefore, the size of the device can be reduced, and the space for the routings can be increased. Some materials and processes used to form the other elements of the semiconductor device 100b are similar to, or the same as, those used to form the semiconductor device 100a, and are not repeated herein.

Figure 4A:
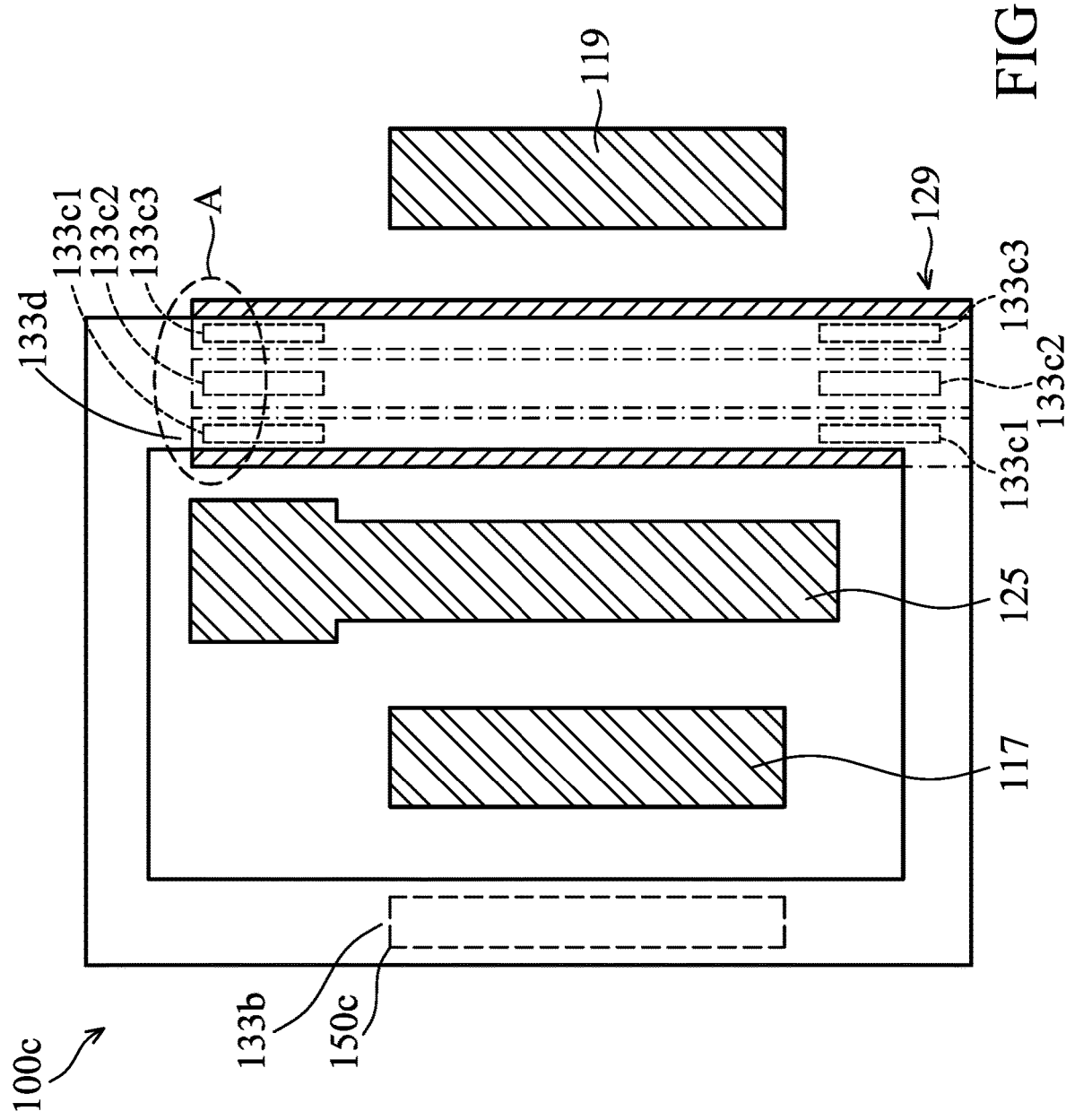
FIG. 4A is a top view illustrating a semiconductor device in accordance with some embodiments.
Figure 4B:
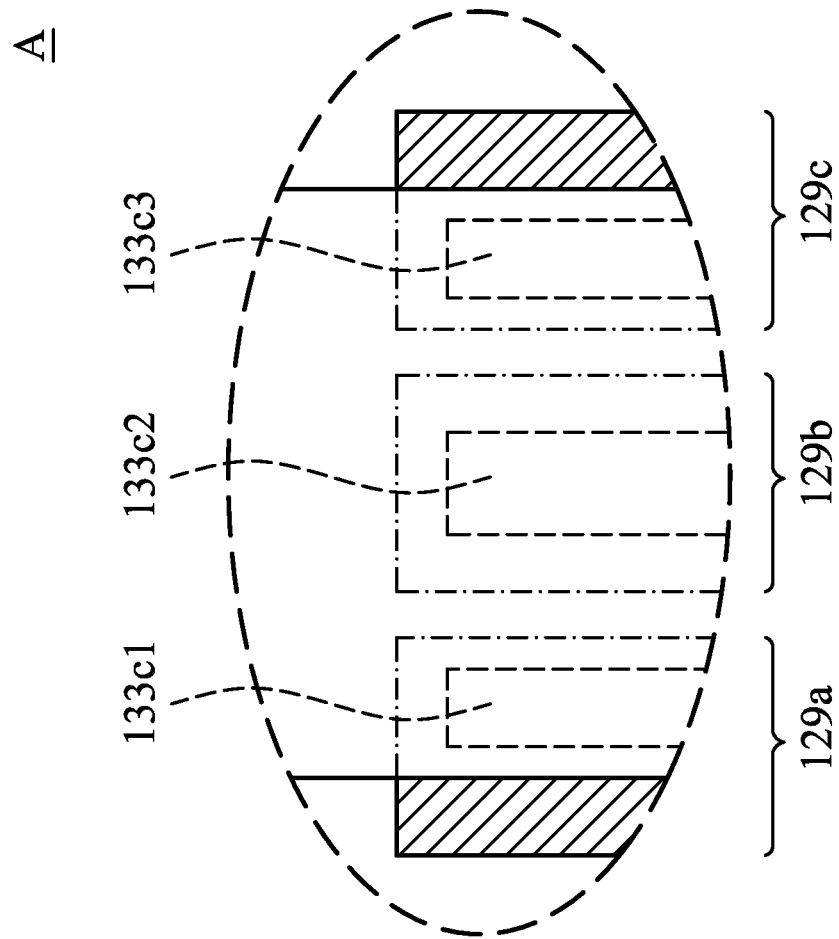
FIG. 4B is an enlarged view illustrating region A of FIG. 4A in accordance with some embodiments.

FIG. 4A is a top view illustrating a semiconductor device 100c in accordance with some embodiments. FIG. 4B is an enlarged view illustrating region A of the semiconductor device 100c in FIG. 4A in accordance with some embodiments. The difference between the semiconductor device 100c of FIGS. 4A-4B and the semiconductor device 100a of FIG. 2 is the shape of the field plate.

As shown in FIGS. 4A and 4B, in the semiconductor device 100c, the field plate 129 includes a first field plate region 129a, a second field plate region 129b and a third field plate region 129c, in accordance with some embodiments. In some embodiments, the first field plate region 129a, the second field plate region 129b and the third field plate region 129c are disposed between the gate metal layer 125 and the drain electrode 119, and the first field plate region 129a, the second field plate region 129b and the third field plate region 129c are physically isolated from each other.

Compared to the semiconductor device 100a, since there are three field plate regions separated from each other and disposed between the gate metal layer 125 and the drain electrode 119 in the semiconductor device 100c (i.e., the first field plate region 129a, the second field plate region 129b and the third field plate region 129c), the electric field close to the drain electrode 119 can be further reduced, such that the distribution of the electric field between the gate metal layer 125 and the drain electrode 119 can be more uniform. As a result, the breakdown problem can be reduced or mitigated.

In addition, the first field plate region 129a is electrically connected to the ring structure including the conductive layers 133b and 133d through a first via 133c1 on the first field plate region 129a, the second field plate region 129b is electrically connected to the ring structure including the conductive layers 133b and 133d through a second via 133c2 on the second field plate region 129b, and the third field plate region 129c is electrically connected to the ring structure including the conductive layers 133b and 133d through a third via 133c3 on the third field plate region 129c. As a result, the first field plate region 129a, the second field plate region 129b and the third field plate region 129c are electrically connected to the composite substrate 106 through the aforementioned ring structure and the conductive structure 150c.

Some materials and processes used to form the first via 133c1, the second via 133c2 and the third via 133c3 are similar to, or the same as, those used to form the vias 133c and 133e of FIGS. 1G and 2, and are not repeated herein. Some materials and processes used to form the conductive structure 150c are similar to, or the same as, those used to form the conductive structure 150a, and are not repeated herein.

FIGS. 4A-4B illustrate two first vias 133c1, two second vias 133c2 and two third vias 133c3. However, the number of first vias 133c1, second vias 133c2 and third vias 133c3 are not limited thereto. For example, either of the first vias 133c1, either of the second vias 133c2 and either of the third vias 133c3 can be omitted in the semiconductor device 100c. Some materials and processes used to form the other elements of the semiconductor device 100c are similar to, or the same as, those used to form the semiconductor device 100a, and are not repeated herein.

Figure 5:
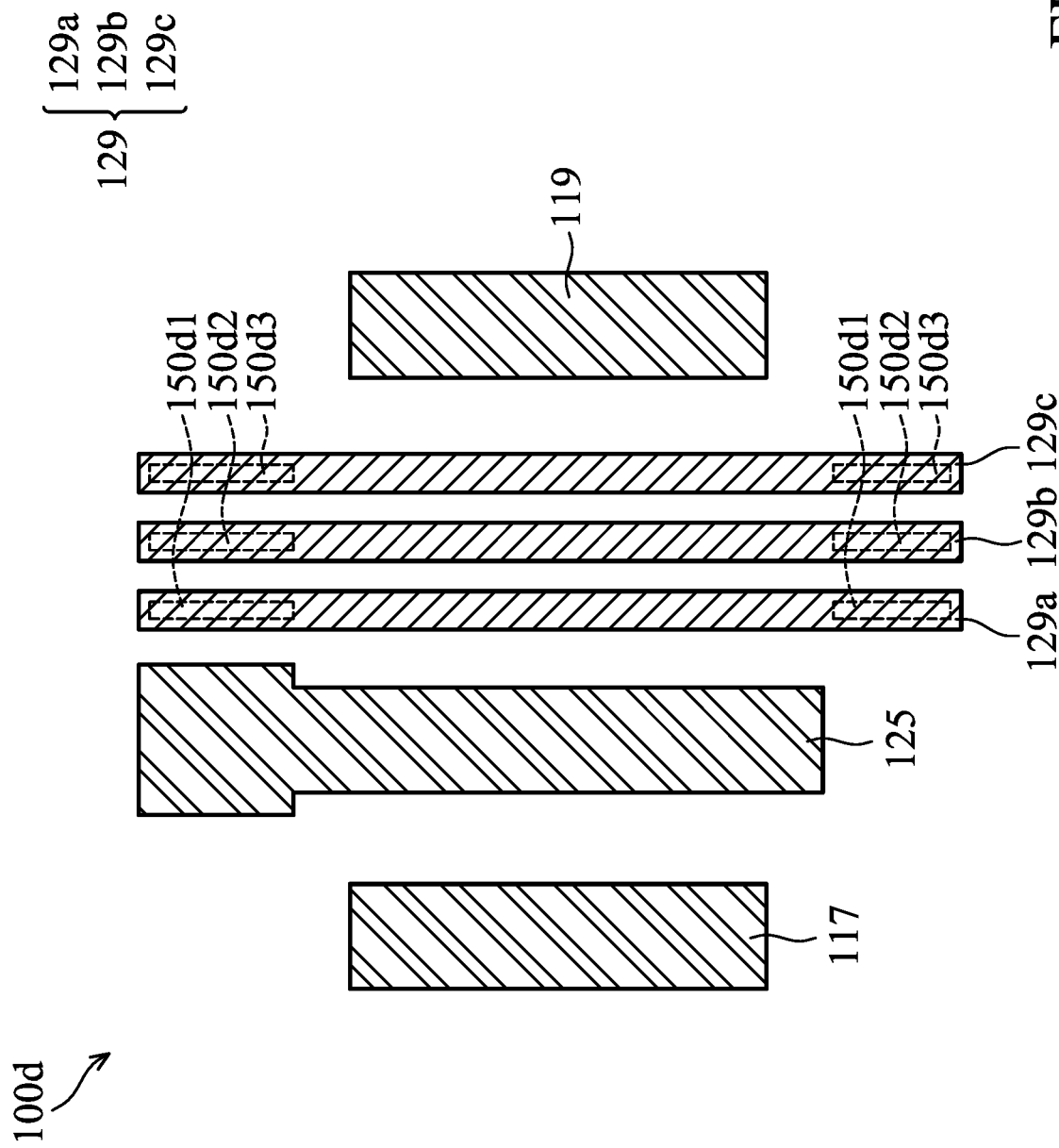
FIG. 5 is a top view illustrating a semiconductor device in accordance with some embodiments.

FIG. 5 is a top view illustrating a semiconductor device 100d in accordance with some embodiments. The difference between the semiconductor device 100d of FIG. 5 and the semiconductor device 100b of FIG. 3 is the shape of the field plate.

As shown in FIG. 5, similar to the semiconductor device 100c of FIG. 4A, the field plate 129 of the semiconductor device 100d includes the first field plate region 129a, the second field plate region 129b and the third field plate region 129c. In some embodiments, the first field plate region 129a, the second field plate region 129b and the third field plate region 129c are physically isolated from each other and disposed between the gate metal layer 125 and the drain electrode 119. Therefore, compared to the semiconductor device 100b of FIG. 3, the electric field close to the drain electrode 119 of the semiconductor device 100d can be further reduced, so as to reduce or mitigate the breakdown problem.

In addition, in the present embodiment, the first field plate region 129a is electrically connected to the composite substrate 106 through a conductive structure 150d1 disposed under the first field plate region 129a, the second field plate region 129b is electrically connected to the composite substrate 106 through a conductive structure 150d2 disposed under the second field plate region 129b, the third field plate region 129c is electrically connected to the composite substrate 106 through a conductive structure 150d3 disposed under the third field plate region 129c, and the conductive structures 150d1, 150d2 and 150d3 are respectively located in the regions directly under the first field plate region 129a, the second field plate region 129b and the third field plate region 129c.

Specifically, the range of the projection of the conductive structure 150d1 on the top surface of the composite substrate 106 is located in the range of the projection of the first field plate region 129a on the top surface of the composite substrate 106. The range of the projection of the conductive structure 150d2 on the top surface of the composite substrate 106 is located in the range of the projection of the second field plate region 129b on the top surface of the composite substrate 106. The range of the projection of the conductive structure 150d3 on the top surface of the composite substrate 106 is located in the range of the projection of the third field plate region 129c on the top surface of the composite substrate 106. Some materials and processes used to form the conductive structures 150d1, 150d2 and 150d3 are similar to, or the same as, those used to form the conductive structure 150a, and are not repeated herein.

FIG. 5 illustrates two conductive structures 150d1, two conductive structures 150d2 and two conductive structures 150d3. However, the number of conductive structures 150d1, 150d2 and 150d3 is not limited thereto. For example, either of the conductive structures 150d1, either of the conductive structures 150d2 and either of the conductive structures 150d3 can be omitted in the semiconductor device 100d. Some materials and processes used to form the other elements of the semiconductor device 100d are similar to, or the same as, those used to form the semiconductor device 100a, and are not repeated herein.

Figure 6B:
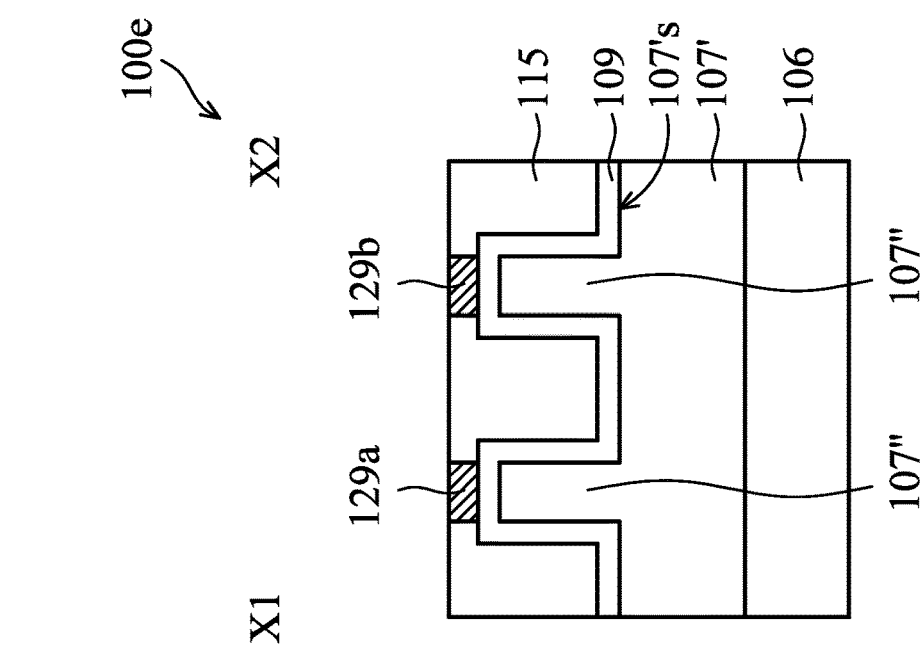
FIG. 6B is a cross-sectional view illustrating a semiconductor device in accordance with some embodiments.
Figure 6A:
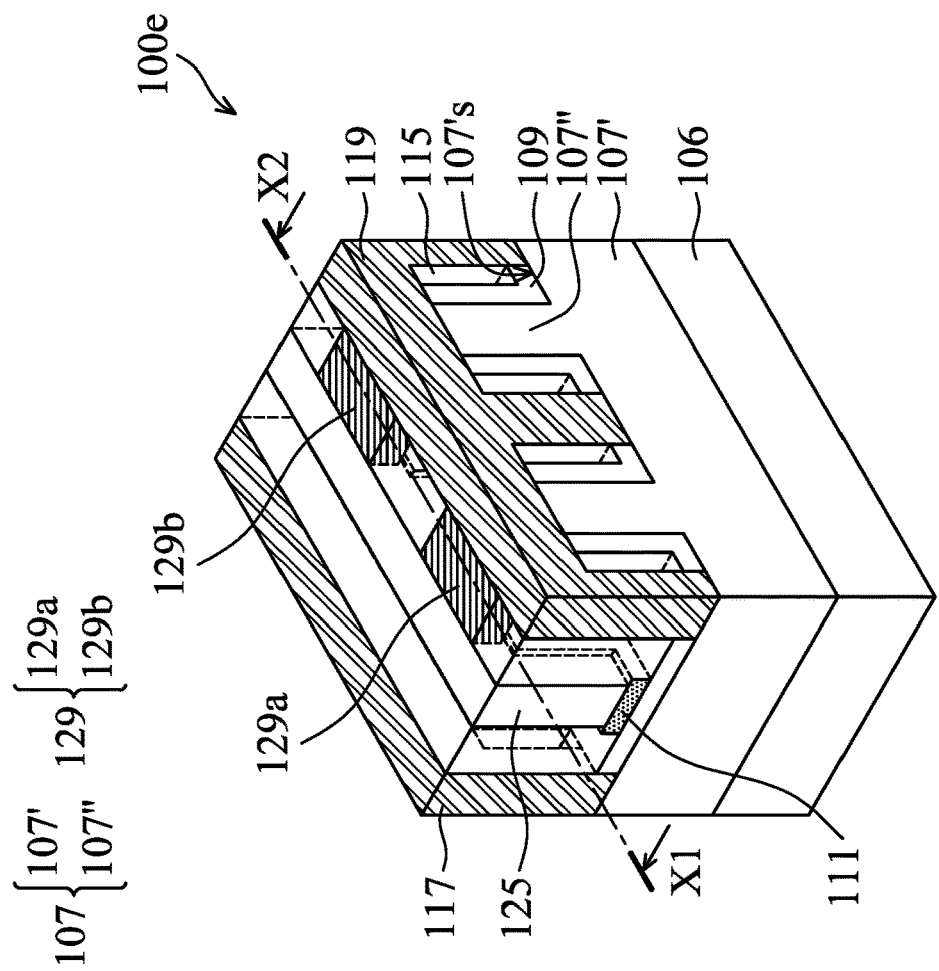
FIG. 6A is a perspective view illustrating a semiconductor device in accordance with some embodiments.

FIG. 6A is a perspective view illustrating a semiconductor device 100e in accordance with some embodiments. FIG. 6B is a cross-sectional view illustrating the semiconductor device 100e in accordance with some embodiments. FIG. 6B is a cross-sectional view along line X1-X2 of the semiconductor device 100e in FIG. 6A.

In the semiconductor device 100e, the first composite III-V groups compound semiconductor layer 107 includes a base 107' and a plurality of fin structures 107" protruding from the base 107', and the base 107' and the fin structures 107" are conformally covered by the second III-V group compound semiconductor layer 109, in accordance with some embodiments. The source electrode 117 and the drain electrode 119 of the semiconductor device 100e are located on the first composite III-V groups compound semiconductor layer 107 and at opposite sides of the gate structure 111. It should be noted that, the field plate 129 includes the first field plate region 129a and the second field plate region 129b, and two of the fin structures 107", which are adjacent to each other, are respectively covered by the first field plate region 129a and the second field plate region 129b.

In some embodiments, the first field plate region 129a and the second field plate region 129b do not extend on the top surface 107's of the base 107'. In addition, the first field plate region 129a and the second field plate region 129b may be electrically connected to the composite substrate 106 through the region outside of the active area (i.e., the range between the source electrode 117 and the drain electrode 119). For example, the first field plate region 129a and the second field plate region 129b may be electrically connected to the composite substrate 106 through the dispositions of the aforementioned conductive structures, the ring structure and/or the vias. Some materials and processes used to form the elements in the semiconductor device 100e are similar to, or the same as, those used to form the elements in the semiconductor device 100a, and are not repeated herein.

Figure 7B:
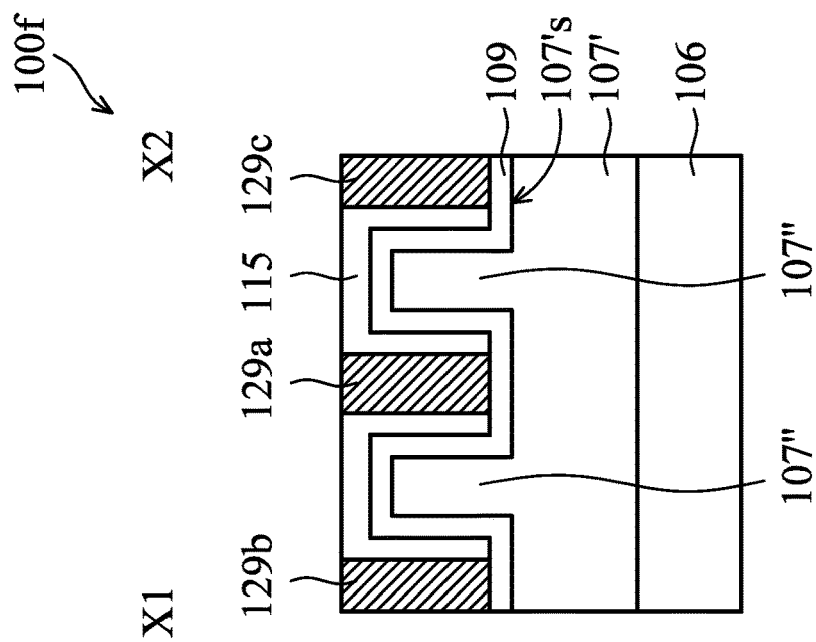
FIG. 7B is a cross-sectional view illustrating a semiconductor device in accordance with some embodiments.
Figure 7A:
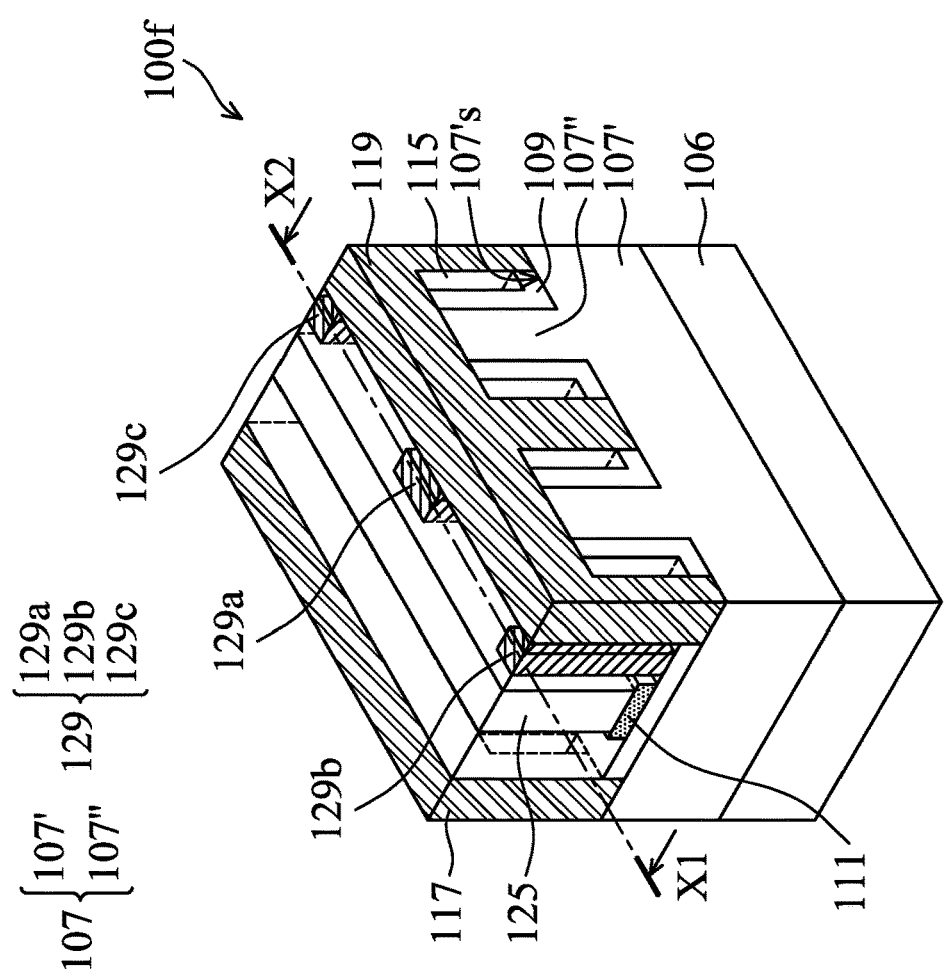
FIG. 7A is a perspective view illustrating a semiconductor device in accordance with some embodiments.

FIG. 7A is a perspective view illustrating a semiconductor device 100f in accordance with some embodiments. FIG. 7B is a cross-sectional view illustrating the semiconductor device 100f in accordance with some embodiments. FIG. 7B is a cross-sectional view along line X1-X2 of the semiconductor device 100f in FIG. 7A. The difference between the semiconductor device 100f and the semiconductor device 100e is the location of the field plate.

In the semiconductor device 100f, the field plate 129 includes the first field plate region 129a, the second field plate region 129b and the third field plate region 129c between the fin structures 107''. Specifically, the top surface 107's of the base 107' is covered by the first field plate region 129a, the second field plate region 129b and the third field plate region 129c. The fin structures 107'' are not covered by the first field plate region 129a, the second field plate region 129b and the third field plate region 129c.

In addition, similar to the semiconductor device 100e, the first field plate region 129a, the second field plate region 129b and the third field plate region 129c may be electrically connected to the composite substrate 106 through the region outside of the active area. For example, the first field plate region 129a, the second field plate region 129b and the third field plate region 129c may be electrically connected to the composite substrate 106 through the dispositions of the aforementioned conductive structures, the ring structure and/or the vias. Some materials and processes used to form the other elements in the semiconductor device 100f are similar to, or the same as, those used to form the semiconductor device 100a, and are not repeated herein.

Figures 8A, 8B:
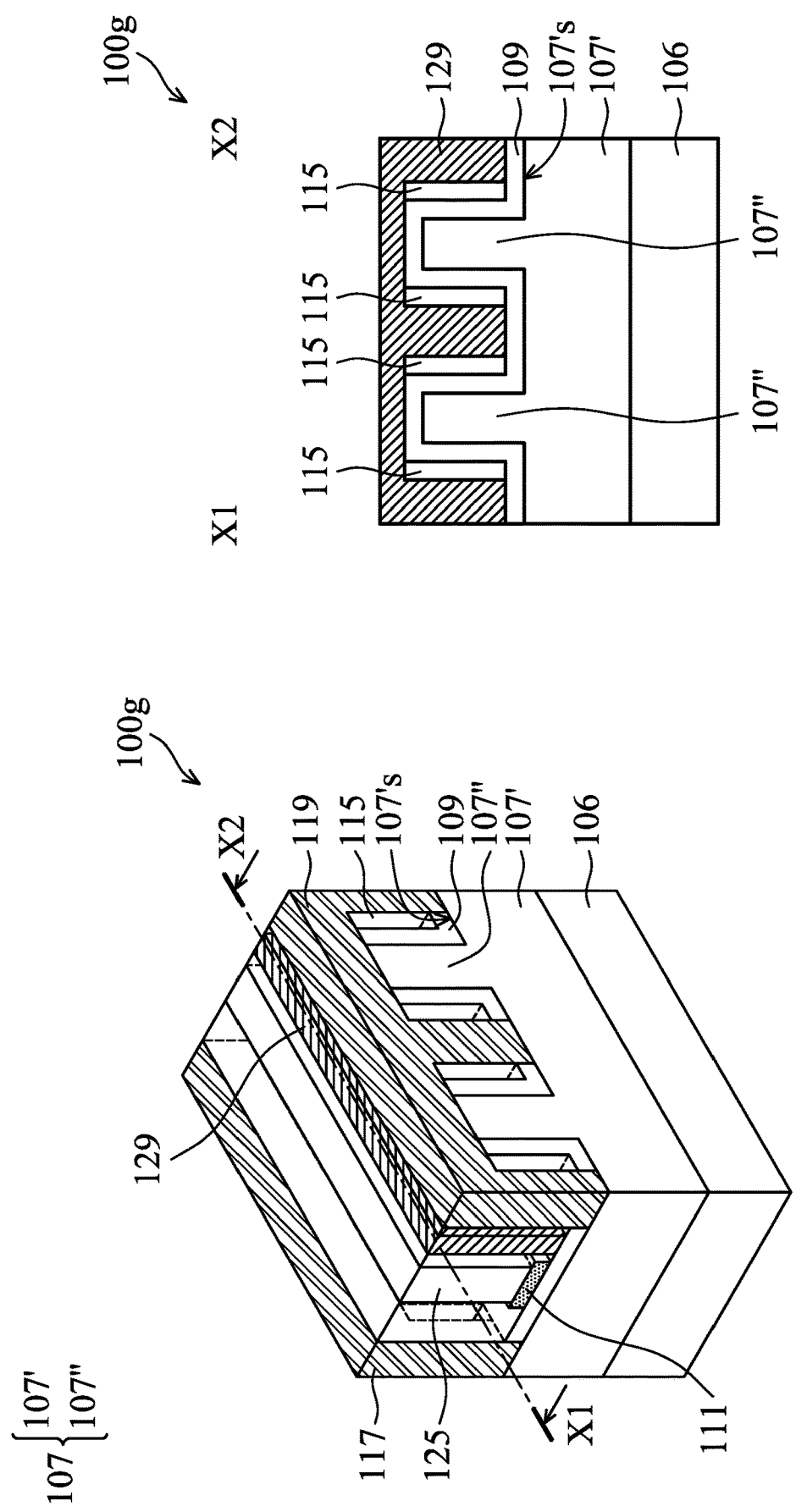
FIG. 8A is a perspective view illustrating a semiconductor device in accordance with some embodiments.
FIG. 8B is a cross-sectional view illustrating a semiconductor device in accordance with some embodiments.

FIG. 8A is a perspective view illustrating a semiconductor device 100g in accordance with some embodiments. FIG. 8B is a cross-sectional view illustrating the semiconductor device 100g in accordance with some embodiments. FIG. 8B is a cross-sectional view along line X1-X2 of the semiconductor device 100g in FIG. 8A. The difference between the semiconductor device 100g and the semiconductor device 100e is the location of the field plate.

Semiconductor device 100g includes the field plate 129 disposed on the second III-V group compound semiconductor layer 109. Specifically, the top surface 107's of the base 109' and the fin structures 107'' are covered by the field plate 129. In addition, similar to the semiconductor device 100e, the field plate 129 may be electrically connected to the composite substrate 106 through the region outside of the active area. For example, the field plate 129 may be electrically connected to the composite substrate 106 through the dispositions of the aforementioned conductive structures, the ring structure and/or the vias. Some materials and processes used to form the other elements in the semiconductor device 100g are similar to, or the same as, those used to form the semiconductor device 100a, and are not repeated herein.

Some embodiments of the disclosure provide semiconductor devices and methods for forming the same (e.g., high-electron mobility transistors (HEMTs)). In some embodiments, the field plate is electrically connected to the composite substrate with high thermal conductivity coefficient through the conductive structure penetrating through the second III-V group compound semiconductor layer and the first composite III-V group compound semiconductor layer, so as to achieve the purposes of heat dissipation and reducing the electric field. As a result, the operational efficiency of the high current density semiconductor device can be improved.

Moreover, the conductive structure is disposed away from the source electrode and the drain electrode so as to prevent the semiconductor device from being damaged. Furthermore, the conductive structure does not extend to the backside of the composite substrate, and does not extend to the region directly under the active area. Therefore, the breakdown voltage of the semiconductor device can remain at a high level, such that the applicable voltage range of the semiconductor device may not be limited.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first composite III-V group compound semiconductor layer disposed on a composite substrate;
   a second III-V group compound semiconductor layer disposed on the first composite III-V group compound semiconductor layer;
   a gate structure disposed on the second III-V group compound semiconductor layer;
   a source electrode and a drain electrode, disposed on the second III-V group compound semiconductor layer and at opposite sides of the gate structure;
   a field plate disposed between the gate structure and the drain electrode; and
   a conductive structure penetrating through the second III-V group compound semiconductor layer and the first composite III-V group compound semiconductor layer, wherein the field plate is electrically connected to the composite substrate through the conductive structure and the conductive structure is electrically isolated from the source electrode by a dielectric layer.

2. The semiconductor device as claimed in claim 1, wherein a bottom surface of the conductive structure is higher than a bottom surface of the composite substrate.

3. The semiconductor device as claimed in claim 1, wherein the first composite III-V group compound semiconductor layer comprises GaN, the second III-V group compound semiconductor layer comprises AlGaN, and the gate structure comprises p-type doped GaN.

4. The semiconductor device as claimed in claim 1, wherein the conductive structure and the gate structure are located at opposite sides of the source electrode.

5. The semiconductor device as claimed in claim 1, wherein the conductive structure is located in a range directly under the field plate.

6. The semiconductor device as claimed in claim 1, wherein the composite substrate comprises:

a substrate;
a buffer layer disposed on the substrate; and
a seed layer disposed on the buffer layer, wherein the conductive structure penetrates through the buffer layer and the seed layer, and the conductive structure is in contact with the substrate.

7. The semiconductor device as claimed in claim 6, wherein the substrate is made of AlN.

8. A semiconductor device, comprising:
a first composite III-V group compound semiconductor layer disposed on a composite substrate;
a second III-V group compound semiconductor layer disposed on the first composite III-V group compound semiconductor layer;
a source electrode, a gate structure and a drain electrode, disposed on the second III-V group compound semiconductor layer, wherein the gate structure is located between the source electrode and the drain electrode;
a first field plate region disposed between the gate structure and the drain electrode; and
a first conductive structure electrically connected to the first field plate region and the composite substrate, wherein the first conductive structure is electrically isolated from the source electrode.

9. The semiconductor device as claimed in claim 8, further comprising:
a via disposed on the first field plate region, wherein a top surface of the first conductive structure is higher than a top surface of the first field plate region, and the first field plate region is electrically connected to the first conductive structure through the via.

10. The semiconductor device as claimed in claim 8, wherein the composite substrate comprises:
an AlN substrate;
an oxide layer disposed on the AlN substrate; and
a silicon layer disposed on the oxide layer, wherein the first conductive structure penetrates through the oxide layer and the silicon layer, and a bottom surface of the first conductive structure is higher than a bottom surface of the AlN substrate.

11. The semiconductor device as claimed in claim 8, further comprising:
a second field plate region and a third field plate region, disposed between the gate structure and the drain electrode, wherein the first field plate region, the second field plate region and the third field plate region are separated from each other;
a first via disposed on the first field plate region;
a second via disposed on the second field plate region; and
a third via disposed on the third field plate region, wherein the first field plate region, the second field plate region and the third field plate region are electrically connected to the first conductive structure through the first via, the second via and the third via respectively, and the first conductive structure and the gate structure are located at opposite sides of the source electrode.

12. The semiconductor device as claimed in claim 8, further comprising:
a second field plate region and a third field plate region, disposed between the gate structure and the drain electrode, wherein the first field plate region, the second field plate region and the third field plate region are separated from each other; and
a second conductive structure and a third conductive structure, wherein the second conductive structure is electrically connected to the second field plate region and the composite substrate, the third conductive structure is electrically connected to the third field plate region and the composite substrate, and
wherein the first conductive structure, the second conductive structure and the third conductive structure are respectively located in ranges directly under the first field plate region, the second field plate region and the third field plate region.

13. The semiconductor device as claimed in claim 8, wherein the first composite III-V group compound semiconductor layer comprises a base and a fin structure protruding from the base, and the fin structure is covered by the first field plate region.

14. The semiconductor device as claimed in claim 8, wherein the first composite III-V group compound semiconductor layer comprises a base and a plurality of fin structures protruding from the base, the first field plate region is located between the fin structures, and the base is covered by the first field plate region.

15. A method for forming a semiconductor device, comprising:
forming a first composite III-V group compound semiconductor layer on a composite substrate;
forming a second III-V group compound semiconductor layer on the first composite III-V group compound semiconductor layer;
forming a source electrode, a gate structure and a drain electrode on the second III-V group compound semiconductor layer, wherein the gate structure is located between the source electrode and the drain electrode;
forming a field plate between the gate structure and the drain electrode; and
forming a conductive structure penetrating through the second III-V group compound semiconductor layer and the first composite III-V group compound semiconductor layer, wherein the field plate is electrically connected to the composite substrate through the conductive structure and the conductive structure is electrically isolated from the source electrode.

16. The method as claimed in claim 15, wherein the step of forming the conductive structure comprises:
removing a portion of the second III-V group compound semiconductor layer and a portion of the first composite III-V group compound semiconductor layer to form a first trench before the source electrode and the drain electrode are formed;
filling a polysilicon material into the first trench to form a first conductive portion of the conductive structure; and
forming a first dielectric layer covering the first conductive portion.

17. The method as claimed in claim 16, wherein the step of forming the conductive structure comprises:
forming a second conductive portion of the conductive structure on the first conductive portion, wherein the second conductive portion and the source electrode are formed in the same process by using the same material.

18. The method as claimed in claim 17, wherein the step of forming the conductive structure comprises:
forming a second dielectric layer on the field plate;
removing a portion of the second dielectric layer to form an opening on the field plate and to form a second trench exposing the second conductive portion; and
filling a metal material into the second trench and the opening such that a third conductive portion of the conductive structure is formed on the second conductive portion and a via is formed on the field plate, wherein the field plate is electrically connected to the conductive structure through the via.

19. The method as claimed in claim 15, wherein the composite substrate comprises an AlN substrate, and the conductive structure extends into the composite substrate and comes into contact with the AlN substrate.

20. The method as claimed in claim 15, wherein the conductive structure does not extend to a region directly under the source electrode.

\* \* \* \* \*